(12) United States Patent
Robert

(10) Patent No.: US 10,199,990 B2
(45) Date of Patent: Feb. 5, 2019

(54) HIGH DYNAMIC RANGE DEVICE FOR INTEGRATING AN ELECTRICAL CURRENT

(71) Applicant: ULIS, Veurey Voroize (FR)

(72) Inventor: Patrick Robert, Reaumont (FR)

(73) Assignee: ULIS (FR)

( * ) Notice: Subject to any disclaimer, the term of this patent is extended or adjusted under 35 U.S.C. 154(b) by 125 days.

(21) Appl. No.: 15/300,641

(22) PCT Filed: Apr. 30, 2015

(86) PCT No.: PCT/FR2015/051164
§ 371 (c)(1),
(2) Date: Sep. 29, 2016

(87) PCT Pub. No.: WO2015/170041
PCT Pub. Date: Nov. 12, 2015

(65) Prior Publication Data
US 2017/0111015 A1    Apr. 20, 2017

(30) Foreign Application Priority Data

May 7, 2014 (FR) ...................... 14 54119

(51) Int. Cl.
*G01J 5/24* (2006.01)
*H03F 1/26* (2006.01)
(Continued)

(52) U.S. Cl.
CPC ............ *H03F 1/26* (2013.01); *G01J 5/24* (2013.01); *H03F 3/005* (2013.01); *H03F 3/087* (2013.01);
(Continued)

(58) Field of Classification Search
CPC ........................................ G01J 5/24
See application file for complete search history.

(56) References Cited

U.S. PATENT DOCUMENTS 5,841,284 A * 11/1998 Takahashi ............ G01R 31/361
324/428
6,157,170 A * 12/2000 Noda .................... G01R 31/361
320/130
(Continued)

FOREIGN PATENT DOCUMENTS

EP        0952456 A2    10/1999
EP        2022256 A2    2/2009
(Continued)

OTHER PUBLICATIONS

Viarani, et al., "A 16-Cell 80DB Dynamic-Range Auto-Ranging Read-Out Array for Uncooled IR Micro-Bolometers", © 2007 IEEE, Transducers & Eurosensors 07, pp. 1361-1364.
(Continued)

*Primary Examiner* — David P Porta
*Assistant Examiner* — Djura Malevic
(74) *Attorney, Agent, or Firm* — Forge IP, PLLC

(57) ABSTRACT

A device for integrating an electric current during a period $T_{int}$, including an operational amplifier and a capacitor connected between a first input and an output of the amplifier, a second input of the amplifier being taken to a voltage VBUS, output voltage $V_{out}$ of the amplifier being saturated at a high voltage $V_{satH}$ and a low voltage $V_{satH}$ according to the charge quantity in the capacitor. The device also includes: a circuit for switching the terminals of the capacitor; and a circuit for triggering the circuit at least once during period $T_{int}$ when voltage $V_{out}$ both grows and is substantially equal to a reference voltage VREF, the voltage VREF being smaller than or equal to voltage $V_{satH}$, and reference voltage VREF and voltage VBUS being selected to comply with relation $2 \cdot VBUS - VREF \geq V_{satL}$; and a storage circuit for storing the number of triggerings having occurred between the initial time and the end time of the integration period.

10 Claims, 5 Drawing Sheets

(51) Int. Cl.
*H03F 3/00* (2006.01)
*H03M 1/18* (2006.01)
*H03F 3/08* (2006.01)
*H03F 3/45* (2006.01)
*H03M 1/50* (2006.01)

(52) U.S. Cl.
CPC ........ *H03F 3/45071* (2013.01); *H03M 1/182* (2013.01); *H03F 2200/261* (2013.01); *H03F 2200/264* (2013.01); *H03M 1/50* (2013.01)

(56) References Cited

U.S. PATENT DOCUMENTS

| | | | | |
|---|---|---|---|---|
| 6,680,615 | B2* | 1/2004 | Nebon | G01R 22/00 324/426 |
| 7,196,523 | B1* | 3/2007 | Yamada | G01R 31/3613 324/428 |
| 7,202,463 | B1 | 4/2007 | Cox | |
| 7,579,892 | B2* | 8/2009 | Kadanka | G06F 1/04 327/291 |
| 7,759,903 | B2* | 7/2010 | Kamata | G01R 31/3658 320/132 |
| 7,888,944 | B2* | 2/2011 | Niroomand | G01R 15/146 320/132 |
| 2003/0016154 | A1* | 1/2003 | Yamamoto | H03M 1/52 341/167 |
| 2012/0132805 | A1* | 5/2012 | Chammings | G01J 5/20 250/332 |
| 2014/0027642 | A1* | 1/2014 | Warashina | G01J 5/00 250/340 |
| 2014/0367573 | A1* | 12/2014 | Okuyama | H04N 5/33 250/338.4 |
| 2015/0138367 | A1* | 5/2015 | Simolon | H04N 5/3559 348/164 |
| 2015/0280047 | A1* | 10/2015 | Seitz | H01L 31/103 250/338.4 |

FOREIGN PATENT DOCUMENTS

FR  2942074 A1  8/2010
WO  2007135175 A2  11/2007

OTHER PUBLICATIONS

Kazuyuki Egashira, et al., "Infrared sensor module using uncooled 320×240/640×480 detector", proc. SPIE 6542. Infrared Technology and Applications XXXIII, 65421R, May 14, 2007, 2 page abstract.

U. Mizrahi, et al., "New features and development directions in SCD's μ-bolometer technology", Proc. SPIE6940, Infrared Technology and Applications XXXIV, 694020, May 1, 2008, 2 page abstract.

Eric Mottin, et al., "Uncooled amorphous silicon technology enhancement for 25 μm pixel pitch achievement", SPIE 4820, Infrared Technology and Applications XXVIII, Jan. 23, 2003, 1 page abstract.

Belenky, et al., "Widening the Dynamic Range of the Readout Integration Circuit for Uncooled Microbolometer Infrared Sensors", © 2004 IEEE, pp. V-600-V-603.

M. Degrauwe, et al., "A Micropower CMOS-Instrumentation Amplifier", IEEE Jouirnal of Solid-State Circuits, vol. SC-20, No. 3, Jun. 1985, 3 pages.

Kazuyuki Egashira, et al., "Infrared sensor module using uncooled 320×240/640×480 detector", proc. SPIE 6542. Infrared Technology and Applications XXXIII, 65421R-1-65421R-11, May 14, 2007.

U. Mizrahi, et al., "New features and development directions in SCD's μ-bolometer technology", Proc. SPIE6940, Infrared Technology and Applications XXXIV, 694020-1-0694020-10, May 1, 2008.

Vittoz, "The Design of High-Performance Analog Circuits on Digital CMOS Chips", (c) 1985 IEEE, pp. 657-665.

Eric Mottin, et al., "Uncooled amorphous silicon technology enhancement for 25 μm pixel pitch achievement", SPIE 4820, Infrared Technology and Applications XXVIII, Jan. 23, 2003, p. 200-207.

* cited by examiner

Fig. 1 (State of the Art)

(State of the Art)

HIGH DYNAMIC RANGE DEVICE FOR INTEGRATING AN ELECTRICAL CURRENT

FIELD OF THE INVENTION

The invention relates to electric current integration, particularly to integrators comprising a capacitor connected in negative feedback on an operational amplifier and delivering an electric voltage which is a function of the charges received and stored in the capacitor.

The invention especially, but not exclusively, relates to the detection of an electromagnetic radiation, and particularly that of infrared. It more specifically applies to thermal imaging by means of array detectors formed of an array of microbolometers, be it conventional imaging intended to form thermal images, or thermal imaging intended to obtain temperature measurements.

The invention thus aims, in particular, at an integrator with a high read-out dynamic range, that is, an integrator capable of measuring an electric current corresponding to a small quantity of electric charges and of measuring an electric current corresponding to a large quantity of electric charges. In particular, in the context of array detection, the invention aims at the forming of images containing the maximum amount of useful data, obtained from scenes having a high flow dynamic range, that is, characterized by large differences in the energy emitted between the various points of the scene, and more specifically a particularly significant temperature difference between "cold" areas and "hot" areas for heat detectors, in the order of several hundreds of degrees Celsius.

BACKGROUND OF THE INVENTION

The developments discussed hereafter are based on the specific case of microbolometer-type heat detectors, in that they especially benefit from the advantages provided by the invention. It should however be specified that the issues expressed in this context apply to any type of device generating electric charges to be measured. In particularly, what is described hereafter applies to all electromagnetic radiation detectors, be they detectors operating, for example, in the visible range, or detectors operating in infrared or beyond in so-called "Terahertz" bands. Similarly, the invention benefits to detectors sensitive to electromagnetic waves, such as heat detectors, for example, of bolometric and capacitive type, or to coupling antennas for the thermal and Terahertz ranges, as well as to so-called quantum detectors, sensitive to electromagnetic energy corpuscles, including detectors operating from as soon as the X, UV, visible, and infrared bands.

In the context of the present invention, term "detector" may be understood as designating any system intended to generate an electric signal in relation with a unit, linear, or two-dimensional distribution of a phenomenon.

In the field of so-called "thermal" infrared detectors, it is known to use one-dimensional or two-dimensional arrays of elements sensitive to infrared radiation, capable of operating at ambient temperature, that is, requiring no cooling at very low temperatures, conversely to detection devices called "quantum detectors", which require an operation at very low temperature, typically that of liquid nitrogen.

A thermal infrared detector conventionally uses the variation of a physical quantity of a so-called "thermometric" or "bolometric" material, according to its temperature. Most currently, this physical quantity is the electric resistivity of said material, which is strongly temperature-dependent. The unit sensitive elements of the detector, or "bolometers", are usually in the form of membranes, each comprising a layer of a thermometric material, and suspended above a substrate, generally made of silicon, via support arms having a high thermal resistance, the array of suspended membranes being usually called "retina". Such membranes especially implement a function of absorption of the incident radiation, a function of conversion of the power of the absorbed radiation into thermal power, and a thermometric function of conversion of the generated thermal power into a variation of the resistivity of the thermometric material, such functions being implementable by one or a plurality of distinct elements. Further, the support arms of the membranes are also conductive and connected to the thermometric layer thereof. Means for sequentially addressing and biasing the thermometric elements of the membranes and means for forming electric signals usable in video formats are usually formed in the substrate having the membranes suspended thereabove. The substrate and the integrated means are commonly called "read-out circuit".

To compensate for the temperature drift of the detector, a solution generally implemented is to arrange, in the electronic circuit for forming the signal in relation with the temperature of the imaging bolometers (thus called since they are sensitive to the incident electromagnetic radiation), an element for compensating the focal plane temperature (FPT), itself bolometric, that is, having its electric behavior following the substrate temperature, but remaining essentially insensitive to radiation. This result is for example obtained by means of bolometric structures provided, by construction, with a lower thermal resistance towards the substrate, and/or by masking these structures behind a shield opaque to thermal radiation. The use of such compensation elements further has the advantage of eliminating most of the so-called common-mode current originating from imaging or "active" bolometers.

FIG. 1 is an electric diagram of a bolometric detector 10 with no temperature regulation, or "TECless" detector of the state of the art, comprising a common-mode compensation structure, and FIG. 2 is an electric diagram of a circuit used to form a read-out signal of a bolometer of the compensated common-mode detector. Such a detector is for example described in document: "*Uncooled amorphous silicon technology enhancement for 25 µm pixel pitch achievement*"; E. Mottin et al, Infrared Technology and Application XXVIII, SPIE, vol. 4820E.

Detector 10 comprises a two-dimensional array 12 of identical unit bolometric detection elements 14, or "pixels", each comprising a sensitive resistive bolometer 16 in the form of a membrane suspended above a substrate, such as previously described, having electric resistance $R_{ac}$.

Each bolometer 16 is connected by one of its terminals to a constant voltage VDET, especially the ground of detector 10, and by its other terminal to a MOS biasing transistor 18 operating in saturated state, for example, an NMOS transistor, setting voltage $V_{ac}$ across bolometer 16 by means of a gate control voltage GAC.

If A designates the node corresponding to the source of MOS 18 and if VA is the voltage at this node, which depends on gate voltage GAC, voltage $V_{ac}$ is then equal to $V_{ac}$=VA−VDET. Pixel 14 also comprises a selection switch 20, connected between MOS transistor 18 and a node S provided for each column of array 12, and driven by a control signal Select, enabling to select bolometer 16 for the reading thereof. Transistor 18 and switch 20 are usually formed in the substrate under the influence of the membrane of bolometer 16. Elements 16 and 18 form a so-called detection branch. Particularly, since the pixels are identical and voltage VDET, on the one hand, and voltage GAC, on the other hand, are identical for all pixels, bolometers 16 are thus voltage-biased under the same voltage $V_{ac}$. Further, gate voltage GAC being constant, voltage $V_{ac}$ is thus also constant.

Detector 10 also comprises, at the foot of each column of array 12, a compensation structure 22, also usually called "skimming" structure. As previously described, the value of the electric resistance of detection bolometers 16 is mainly dictated by the substrate temperature. The current flowing through a detection bolometer 16 thus comprises a significant component which depends on the substrate temperature and is independent from the observed scene. Compensation structure 22 has the function of delivering an electric current for purposes of partial or total compensation of this component.

Structure 22 comprises a compensation bolometer 24, of electric resistance $R_{cm}$, made insensitive to the incident radiation originating from the scene to be observed. Bolometer 24 is constructed by means of the same thermometric material as bolometer 16, but has a very low thermal resistance towards the substrate. For example:
- the resistive elements of compensation bolometer 24 are directly formed in contact with the substrate, or
- bolometer 24 comprises a membrane similar to that of detection bolometers 16 suspended above the substrate by means of structures having a very low thermal resistance, or also
- compensation bolometer 24 comprises a membrane and support arms substantially identical to those of detection bolometers 16 and a material which is a good thermal conductor fills the space between the membrane of bolometer 24 and the substrate.

The electric resistance of bolometer 24 is thus essentially dictated by the substrate temperature, bolometer 24 then being said to be "thermalized" to the substrate.

Bolometer 24 is connected at one of its terminals to a positive constant voltage VSK, and compensation structure 22 further comprises a MOS biasing transistor 26 operating in saturated state, having a polarity opposite to that of transistors 18 of detection pixels 14, for example, a PMOS transistor, setting voltage $V_{cm}$ across bolometer 24 by means of a gate control voltage GCM, and connected between the other terminal of compensation bolometer 24 and node S.

Calling B the node corresponding to the drain of MOS transistor 26 and VB the voltage at this node, voltage $V_{cm}$ is then equal to $V_{cm}=VSK-VB$. Elements 24 and 26 form a so-called compensation branch common to each column.

The value of the common-mode compensation current is defined by the value of resistance Ron of bolometer 24 and of the biasing parameters thereof.

Detector 10 also comprises, at the foot of each column of array 12, an integrator 28 of CTIA type ("Capacitive TransImpedance Amplifier"), for example comprising an operational amplifier 30 and a single capacitor 32 of fixed capacitance $C_{int}$ connected between the inverting input and the output of amplifier 30. The inverting input and the non-inverting input thereof are further respectively connected to node S and to a positive constant voltage VBUS. Voltage VBUS thus forms a reference for the output signals, and is between VDET and VSK. A switch 34 driven by a signal Reset is also provided in parallel with capacitor 32, for the discharge thereof. The outputs of CTIAs 28 are eventually for example connected to respective sample-and-hold circuits 36 for the delivery of voltages $V_{out}$ of CTIAs in multiplexed mode by means of a multiplexer 38 towards one or a plurality of series output amplifier(s) 40. It may also be integrated at the output of the digitizing means by analog-to-digital converters (ADC).

Finally, detector 10 comprises a sequencing unit 42 controlling the different previously-described switches.

In operation, array 12 is read out line by line. To read from a row of array 12, switches 20 of the line of pixels 14 are turned on and switches 20 of the other lines are turned off. The successive reading of the assembly of lines of array 12 forms a frame.

For the reading of a bolometer 16 of a line of array 12 selected for the reading, after a phase of discharge of the capacitors of the CTIAs at the foot of the column, achieved by the turning on of switches 34 by means of signal Reset, followed by their turning off, a circuit such as shown in FIG. 2 is thus obtained for each pixel in the line being read.

A current $I_{ac}$ flows through detection bolometer 16 of the pixel under the effect of its voltage biasing by MOS transistor 18, and a current $I_{cm}$ flows through compensation bolometer 24 of the compensation structure under the effect of its voltage biasing by MOS transistor 26. These currents are subtracted from each other at node S, and the resulting current difference is integrated by CTIA 28 during a predetermined integration period $T_{int}$. Output voltage $V_{out}$ of CTIA 28 thus is a measurement of the variation of the resistance of detection bolometer 16 caused by the incident radiation to be detected since the non-useful part of current $I_{ac}$ depending on the substrate temperature is at least partly compensated for by current $I_{cm}$ specifically generated to reproduce this non-useful part.

Assuming that the electric resistances of active bolometer 16 and of compensation bolometer 24 are not significantly modified on biasing thereof by a self-heating phenomenon, and that CTIA 28 does not saturate, output voltage $V_{out}$ of the integrator at the end of integration time $T_{int}$ can be expressed by relation:

$$V_{out} = V_{bus} + \frac{1}{C_{int}} \int_0^{\Delta T_{int}} (i_{ac} - i_{cm}) dt = \frac{(i_{ac} - i_{cm}) \cdot T_{int}}{C_{int}} + VBUS \quad (1)$$

As known per se, a CTIA has a fixed electric output dynamic range or "read-out" dynamic range. Below a first quantity of electric charges received as an input, the CTIA supplies a low fixed voltage, called "low saturation voltage" ($V_{satL}$). Similarly, above a second quantity of electric charges received as an input, the CTIA supplies a high fixed voltage, called "high saturation voltage" ($V_{satH}$). Relation (1) expresses the linear behavior of the CTIA, when it receives a quantity of electric charges greater than the first quantity of electric charges, and smaller than the second quantity of electric charges. The read-out dynamic range is essentially determined by the value of capacitance $C_{int}$ of capacitor 32. Particularly, when this capacitance is fixed, that is, constant along time, the read-out dynamic range of the CTIA is also fixed.

By convention, in the context of the invention, low and high saturation voltages $V_{satL}$ and $V_{satH}$ are the limits between which the CTIA supplies an output considered as linear, even if it is generally capable of supplying lower or higher voltages than these terminals.

Further, the integration capacity also determines the sensitivity, or more exactly the responsivity of the detector. The responsivity of a detector is defined by the variation of output signal $V_{out}$ in relation with the variation of the input signal (scene temperature $T_{scene}$), that is, $dV_{out}/dT_{scene}$. The observable dynamic range of the scene, or "scene dynamic range" is defined by the maximum temperature difference in a scene which causes no saturation of the output signals of the CTIAs or, in other words, the difference between the highest temperature inducing no high saturation of the CTIAs and the lowest temperature inducing no low saturation of the CTIAs. The sensitivity (responsivity) of a detector accordingly is the ability thereof to detect the details of a scene, while the scene dynamic range of the detector is its ability to transcribe with no distortion very large temperature variations in a scene. It is thus impossible to simultaneously optimize these two contradictory quantities with a fixed integration capacity.

The state of the art thus provides favoring one or the other of these quantities according to the targeted application. Usually, the user either chooses a high sensitivity, and the observable scene dynamic range is necessarily decreased, for example, to a few tens of degrees, or a high scene dynamic range, for example, 200° C., and the detector only has a low sensitivity whatever the observed scene. In other words, the user adjusts the operating point of the detector to respond at best to its need in terms of tradeoff between the sensitivity and the scene dynamic range.

The above considerations apply to any system forming an electric input signal current $I_{in}$, an example of which is above-described difference $i_{ac}-i_{cm}$, intended to be "read out" by means of an integrator, particularly of CTIA type. In this wide context, the inherent antagonism between the need for a high dynamic range acceptable at the input (here, at the level of the thermal scene) and the contradictory need for a high gain of the signal-forming chain which defines the system sensitivity, in particular the integrator gain $dV_{out}/dI_{in}=T_{int}/C_{int}$.

Complex layouts have been provided to adapt the read-out dynamic range of an integrator to the quantity of electric charges that it receives. In the context of an application to detection, this enables to extend the scene dynamic range while keeping a high sensitivity.

Thus, document Proc. of SPIE Vol. 6940, 694020, (2008) provides arranging in parallel two selectable capacitors instead of single capacitor 32, a capacitor having a low capacitance and a capacitor having a high capacitance. For the reading from the array of unit detectors, a so-called "combined mode" is implemented. This mode alternates the forming of a frame with a high gain by the selection of the capacitors of low capacitance for the CTIAs, and thus of high sensitivity, followed by the forming of a frame with a small gain by the selection of the capacitors of high capacitance for the CTIAs, and thus with a high scene dynamic range.

The defect of this operating mode is a limitation of the availability of high rate data in real time. Indeed, only one frame is displayed for three read frames. The frame frequency is thus equal to one third of the usual frame frequency.

Document Proc. of SPIE Vol. 6542, 65421R, (2007) describes an array detector similar to that previously described. It however differs by a variable integration time according to the position of the pixels. In particular, a long integration time is applied to one pixel, and a shorter integration time is applied to a pixel next to the first pixel, the space distribution of the integration times being applied to the entire array according to a tablecloth pattern. Once a frame has been read with the different integration times, a logic sequencer compares the signal originating from the pixel with a threshold. When the voltage originating from a pixel read with a high gain, that is, with the high integration time, exceeds the threshold, this voltage is replaced in the frame by the average of the voltages originating from the neighboring pixels read with a low gain, that is, with the short integration time. However, when the voltage originating from a pixel read with a low gain is below the threshold, this voltage is replaced in the frame by the average of the voltages originating from the neighboring pixels read with the high gain. One can easily imagine the significant loss of information, particularly relating to high and low temperatures details since the modified frame is an average.

Document WO 2007/135175 describes a circuit for resetting the pixels of an image sensor, provided with CTIAs for reading out the electric charges generated by the unit detection elements. During the integration time, the output voltage of each CTIA is successively sampled three times at three fixed moments:

the first sampled voltage is used to suppress the switching noise (called "kTC noise") of the two other acquired voltages, via a correlated double sampling device (called "CDS");

the second voltage enables to capture the details of the scene; and the third voltage enables to manage a strong scene dynamic range.

The voltages thus obtained are then digitized and processed by means of a complex algorithm which applies a gain to the last two voltages once their kTC noise has been corrected, and which chooses which one will be provided at the output to avoid saturations and provide a maximum dynamic range.

This solution consumes significant software and memory means due to the subsequent processing of the necessary information, external to the image sensor, and of the signal-forming means. Further, this solution supplies output information shifted in time with respect to the events of the scene, due to the multiple sampling and to the time dedicated to the associated calculations. This defect is called "time inconsistency" or asynchronism.

Document U.S. Pat. No. 7,202,463 describes an image sensor comprising photodiodes. For the reading of each photodiode, a capacitor connected in parallel therewith which integrates the electric charges generated by the photodiode is provided. A comparator is connected to the capacitor to compare the voltage thereof with a threshold voltage and a capacitor discharge circuit, connected at the comparator output, discharges the capacitor when its voltage is greater than the threshold voltage. Finally, a circuitry also provided to count the number of times that the threshold voltage is exceeded by the capacitor voltage during the integration period. The final signal is then restored by multiplying the threshold voltage by the number of counted times, to which the final value of the sensor capacitor voltage is added. This system provides a high scene dynamic range, but due to the repeated discharge of the integration capacity, the final signal is tainted with significant noise, all the higher as the number of discharges of the capacitor is high.

SUMMARY OF THE INVENTION

The present invention aims at providing a CTIA-based electric current integration device which has an extended read-out dynamic range without compromising the system sensitivity, while limiting the noise in the final delivered signal.

For this purpose, the invention aims at a device for integrating an electric current received on an integration node for a period of predetermined duration $T_{int}$, comprising an operational amplifier having a first and a second input and an output, and a capacitor having two terminals connected between the first input and the output of the operational amplifier, the second input of the amplifier being taken to a constant voltage VBUS, the first input of the amplifier being connected to the integration node, and the output of the operational amplifier delivering an output voltage $V_{out}$ which varies monotonously in a predetermined variation direction according to a quantity of electric charges of predetermined polarity stored in the capacitor, output voltage $V_{out}$ of the operational amplifier being saturated at a high saturation voltage $V_{satH}$ when the quantity of electric charges of said polarity stored in the capacitor is higher than a predetermined threshold, and output voltage $V_{out}$ of the operational amplifier being saturated at a low saturation voltage $V_{satL}$ when the quantity of electric charges of said polarity stored in the capacitor is lower than a predetermined threshold.

According to the invention, the device further comprises:
  a circuit for switching the capacitor terminals; and
  a circuit for triggering the switching circuit at least once during integration period $T_{int}$ when output voltage $V_{out}$ of the operational amplifier both varies in said variation direction and is substantially equal to a reference voltage VREF,
    when said variation direction is increasing, said reference voltage VREF being smaller than or equal to high saturation voltage $V_{satH}$, and reference voltage VREF and voltage VBUS of the second input of the operational amplifier are selected to comply with relation $2 \cdot VBUS - VREF \geq V_{satL}$; or
    when said variation direction is decreasing, said reference voltage VREF being greater than or equal to low saturation voltage $V_{satL}$, and reference voltage VREF and voltage VBUS of the second input terminal of the operational amplifier (62) are selected to satisfy relation $2 \cdot VBUS - VREF \leq V_{satH}$;
  a storage circuit for storing the number of triggerings having occurred between the initial time and the end time of the integration period.

Switching of the capacitor terminals, or more simply, "switching of the capacitor", means the momentary interruption of the electric continuity between plates A1 and A2 of the integration capacitor and their respective nodes of connection to circuit N1 and N2, and then the forming of a new electric continuity between A1 and N2 and between A2 and N1 of the circuit.

In other words, due to the capacitor switching, an autonomous automatic extension of the read-out dynamic range of the CTIA according to the received electric charges is obtained, with no modification of the sensitivity of the signal-forming chain, in particular of the value of the capacitor and of the integration time. When the output voltage of the CTIA reaches the reference voltage, the capacitor is switched without being discharged. The kept electric charges define, after the switching, a new output voltage of the CTIA, lower (when the output voltage is increasing) than that before the switching, from which the integration carries on. The useful output signal is determined according to the number of switchings, to the voltage decrement (or increment) generated by a switching, and optionally to the output voltage of the CTIA at the end of the integration time.

Further, since the capacitor is never discharged, the noise is limited. Further, the device forms an image signal consistent in time with the received charges, without using a complex digital or/and algorithmic processing subsequent to the forming of signals originating from a plurality of pixels. Further, the additional circuits used with respect to a simple CTIA consume very little power and substrate surface area, and have a dynamic range extensible according to needs.

Advantageously, the number of switchings performed over the integration time and the output voltage of the CTIA are supplied jointly for each detections site. Particularly, according to an advantageous feature of the invention, the storage circuit outputs a digital signal over n bits coding the number of electric charges to be added to the charge corresponding to the analog signal at the output of the CTIA at the end of the integration period.

According to an embodiment, the switching circuit comprises:
  a first controllable switch connected between the first input of the operational amplifier and the first terminal of the capacitor;
  a second controllable switch connected between the output of the operational amplifier and the second terminal of the capacitor;
  a third controllable switch connected between the first input of the operational amplifier and the second terminal of the capacitor;
  a fourth controllable switch connected between the output of the operational amplifier and the first terminal of the capacitor,
and the first and the second controllable switches are controlled by a first binary control signal, the third and the fourth controllable switches are controlled by a second binary control signal, the second binary signal being the complement of the first binary signal.

According to an embodiment, the triggering circuit comprises a comparator having a first input connected to the output of the amplifier and a second input connected to the reference voltage, the comparator generating a first voltage on its output when the voltage on its first input is lower than the voltage on its second input, and generating a second voltage, different from the first voltage, on its output when the voltage on its first input is greater than the voltage on its second input, so that a condition necessary for the triggering of the switching circuit implemented by the triggering circuit is fulfilled:
  on switching from the first voltage to the second voltage if said variation direction is increasing; or
  on switching from the second voltage to the first voltage if said variation direction is decreasing.

According to an embodiment, the triggering of the switching of the capacitor implemented by the triggering circuit comprises fulfilling at the same time:
  a first sub-condition according to which the output voltage of the operational amplifier varies in said variation direction and is substantially equal to the reference voltage; and
  a second sub-condition according to which the number of times when the first sub-condition has been fulfilled from the initial time of the integration period is shorter than a predetermined maximum number.

More particularly, the triggering circuit comprises a binary counter over n bits having a counting input connected to the output of the comparator and an output supplying the number of times from the initial time of integration period Tint when the output of the comparator switches from the first voltage to the second voltage when said variation direction is increasing or switches from the second voltage to the first voltage when said variation direction is decreasing.

The maximum number of switchings of the second subcondition, strictly greater than 1, is determined according to the targeted application. It may be sufficiently large for the maximum number of switchings to only be seldom or never reached in practice and for the number of switchings to thus be in practice determined by the end of the integration period.

Particularly, the triggering circuit comprises a signal generator connected to the output of the binary counter and switching the first and second binary control signals of the switches when the output of the binary counter is incremented.

The invention also aims at an electromagnetic radiation detection system, comprising:
- a detection element generating on an output terminal an electric current according to the electromagnetic radiation; and
- a device of the above-described type, the first input terminal of the operational amplifier being capable of being connected to the output terminal of the detection element for the integration of the current generated by the detection element.

Particularly, the detection element comprises:
- a detection branch, comprising a detection bolometer having a membrane suspended above a substrate and a bias circuit to set the voltage across the detection bolometer according to a voltage set point;
- a compensation branch, comprising a compensation bolometer substantially taken to the substrate temperature, and a bias circuit for setting the voltage across the compensation bolometer according to a voltage set point;
- and means for forming the difference between the current running through the detection bolometer and the current running through the compensation bolometer to form the electric current to be integrated.

The invention also aims at a method of integrating an electric current during a predetermined integration period $T_{int}$ in a capacitor having two terminals connected between the first input and the output of an operational amplifier, the operational amplifier comprising a second input taken to a constant voltage VBUS, output voltage $V_{out}$ of the operational amplifier varying monotonously according to a predetermined variation direction according to a quantity of electric charges of predetermined polarity stored in the capacitor, said output voltage $V_{out}$ being saturated at a high saturation voltage $V_{satH}$ when the quantity of electric charges stored in the capacitor is greater than a predetermined threshold, and output voltage $V_{out}$ of the operational amplifier being saturated at a low saturation voltage $V_{satL}$ when the quantity of electric charges of said polarity stored in the capacitor is smaller than a predetermined threshold, the method comprising the steps of:
a) before the initial time of integration duration $T_{int}$, initializing to zero the capacitor charge and a counting value;
b) integrating during integration duration $T_{int}$ the electric current in the capacitor;
c) switching the capacitor terminals at least once during integration period $T_{int}$ when the output voltage of the operational amplifier both varies in said variation direction and is equal to a predetermined reference voltage VREF,
   when said variation direction is increasing, said reference voltage VREF being smaller than or equal to high saturation voltage $V_{satH}$, and reference voltage VREF and voltage VBUS of the second input of the operational amplifier (62) are selected to comply with relation 2·VBUS−VREF≥$V_{satL}$; or
   when said variation direction is decreasing, said reference voltage VREF being greater than or equal to low saturation voltage $V_{satL}$, and reference voltage VREF and voltage VBUS of the second input of the operational amplifier are selected to comply with relation 2·VBUS−VREF≤$V_{satH}$;
d) incrementing by one the counting value after each switching of the capacitor during integration period $T_{int}$;
e) after the end time of integration period $T_{int}$, supplying the counting value.

According to an embodiment, the capacitor is switched as long as the counting value is smaller than a predetermined maximum value.

BRIEF DESCRIPTION OF THE DRAWINGS

The present invention will be better understood on reading of the following description provided as an example only in relation with the accompanying drawings, where the same reference numerals designate the same or similar elements, among which.

DETAILED DESCRIPTION OF THE INVENTION

Figure 3:
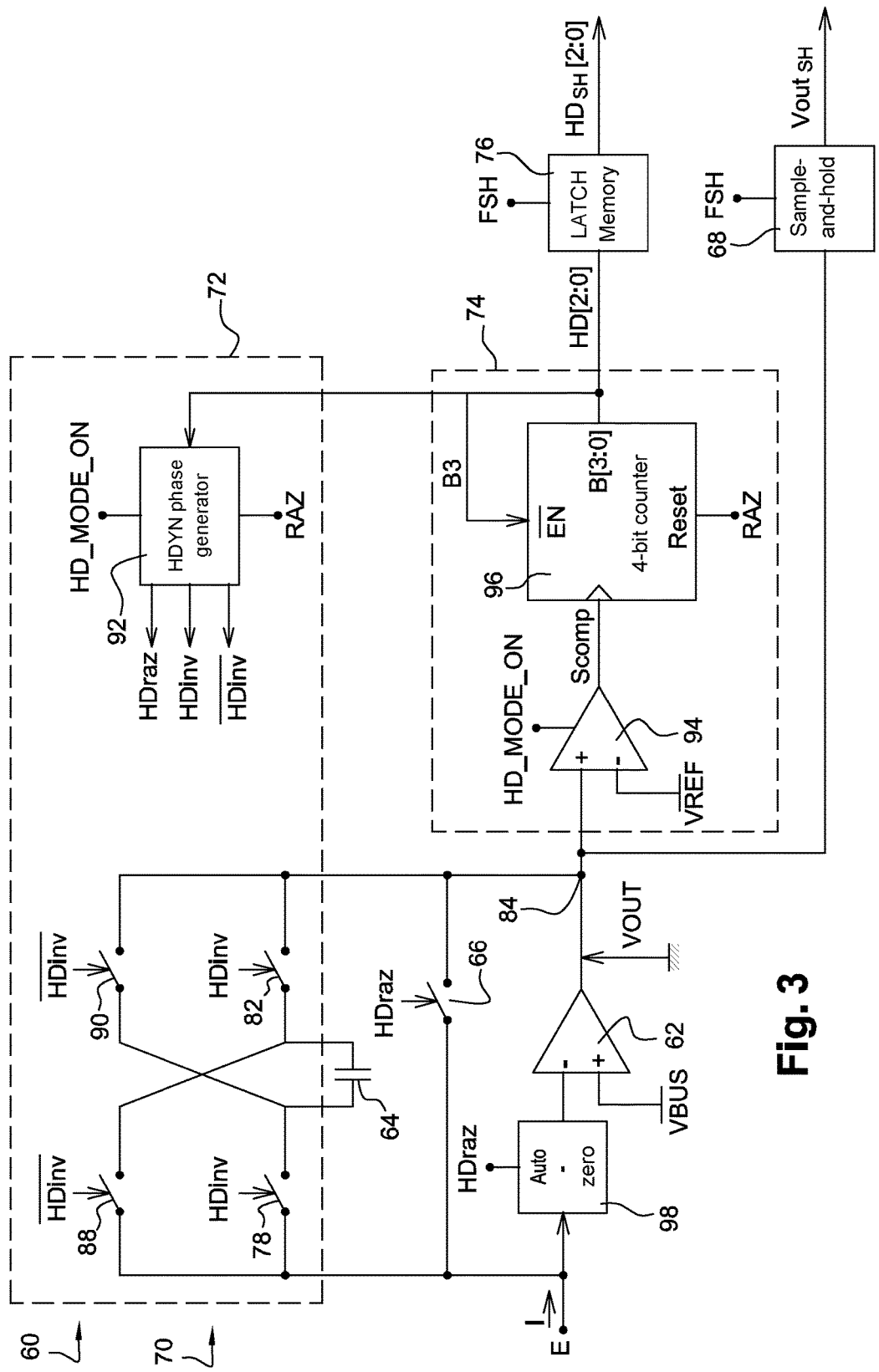
FIG. 3 is an electric diagram of an electric current integration device according to the invention.

Referring to FIG. 3, an integration device 60 according to the invention comprises a CTIA-type integrator comprising an operational amplifier 62 and a signal capacitor 64, of fixed capacitance $C_{int}$, connected between the inverting input and the output of amplifier 62. The non-inverting input (+) thereof is connected to a constant positive voltage VBUS and the inverting input (−) is connected to the input or integration node E conducting an electric current I to be integrated.

A switch 66, driven by a signal HDraz, is also provided in parallel with capacitor 64, for the discharge thereof, and thus its "resetting".

Device 60 is completed with a sample-and-hold circuit 68 connected at the output of operational amplifier 62 to sample and hold voltage $V_{out}$ at the output thereof.

In addition to the above-described CTIA integrator, device 60 is completed with circuits 70 of automatic extension of the read-out dynamic range of the CTIA 62, 64. Circuit 70 comprises:
- a circuit 72 inverting the direction of the connection of capacitor 64 across operational amplifier 62 on reception of a control signal HD[2:0];
- a circuit 74 detecting a switching condition of capacitor 64 according to output voltage $V_{out}$ of amplifier 62 and generating control signal HD[2:0]; and a circuit 76 storing the number of switchings of capacitor 64.

Switching circuit 72 comprises:
- a first controllable switch 78 connected between the inverting input (−) of amplifier 62 and a first terminal 80 of capacitor 64, the first switch being driven by a first control signal HDinv;
- a second controllable switch 82 connected between output 84 of amplifier 62 and a second terminal 86 of capacitor 64, the second switch being driven by first control signal HDinv;
- a third controllable switch 88 connected between the inverting input (−) of amplifier 62 and second terminal 86 of capacitor 64, the third switch being driven by a second control signal $\overline{\text{HDinv}}$;
- a fourth controllable switch 90 connected between output 86 of amplifier 62 and first terminal 80 of capacitor 64, the fourth switch being driven by second control signal $\overline{\text{HDinv}}$; and
- a phase generator 92 receiving control signal HD[2:0] and generating control signals HDinv and $\overline{\text{HDinv}}$ as a function thereof.

In particular, signals HDinv and $\overline{\text{HDinv}}$ are in phase opposition. For example, these signals are binary signals which are logic complements of each other. Thus, the first and second switches 78, 82, which have the same state, are off while the third and fourth switches 88, 90, which have the same state, are on, and vice versa. Two connection states of capacitor 64 are thus defined, that is:
- a first state having first and second terminals 80, 86 of capacitor 64 respectively connected to node E and to output 84 of amplifier 62, and
- a second state having first and second terminals 80, 86 of capacitor 64 respectively connected to output 84 of amplifier 62 and to node E.

The switching of signal HDinv, and thus of signal $\overline{\text{HDinv}}$, accordingly causes the inversion of the connection state of capacitor 64, that is, the switching thereof.

Phase generator 92 also generates signal HDraz driving switch 66 for resetting capacitor 64 according to an initialization control signal RAZ as explained hereafter.

Phase generator 92 also implements a function of activation and deactivation of the automatic extension mode of the read-out dynamic range according to a mode selection signal HD_MODE_ON, in a way which will also be described hereafter.

Detection circuit 74 comprises:
- a comparator 94 receiving on a first terminal (+) output voltage $V_{out}$ of amplifier 62 and, on a second terminal (−) a reference voltage VREF greater than voltage VBUS and smaller than or equal to high saturation voltage $V_{satH}$ of the CTIA. Comparator 94 outputs a voltage $S_{comp}$ having a first value when voltage $V_{out}$ is smaller than voltage VREF, and having a second value, different from the first value, when voltage $V_{out}$ is greater than or equal to voltage VREF. In particular, the switching of voltage $S_{comp}$ from the first value to the second value means that voltage $V_{out}$ is increasing and has just crossed reference voltage VREF;
- a binary counter 96, having its counting input connected to the output of comparator 94. The binary counter is for example designed to count the rising pulse edges, the second voltage value of the comparator being then selected to be greater than the first voltage value. Counter 96 has a predetermined number of bits, for example 4, and receives on an initialization terminal initialization signal RAZ for its resetting. Further, counter 96 is configured to be blocked once its maximum value has been reached. Finally, the output signal of binary counter 96, which is for example delivered on 3 outputs in parallel, an output being provided for each bit of the counter, supplies control signal HD[2:0] of phase generator 92.

Storage circuit 76 is for example formed of an asynchronous "LATCH"-type asynchronous digital memory, which receives the counter value contained in signal HD[2:0] and holds this value in its output signal HDsh[2:0]. Storage circuit 76 and sample-and-hold circuit 68 are driven by the same sampling signal FSH to keep at the output the signals received as an input.

Finally, integration device 60 according to the invention advantageously comprises an "autozero" circuit 98 connected to the inverting input (−) of amplifier 62, to cancel the offset of amplifier 62 and the low-frequency noise thereof as known per se, and for example described in document IEEE journal of solid-state circuits, vol sc-20, n° 3, June 1985.

Figure 4A:
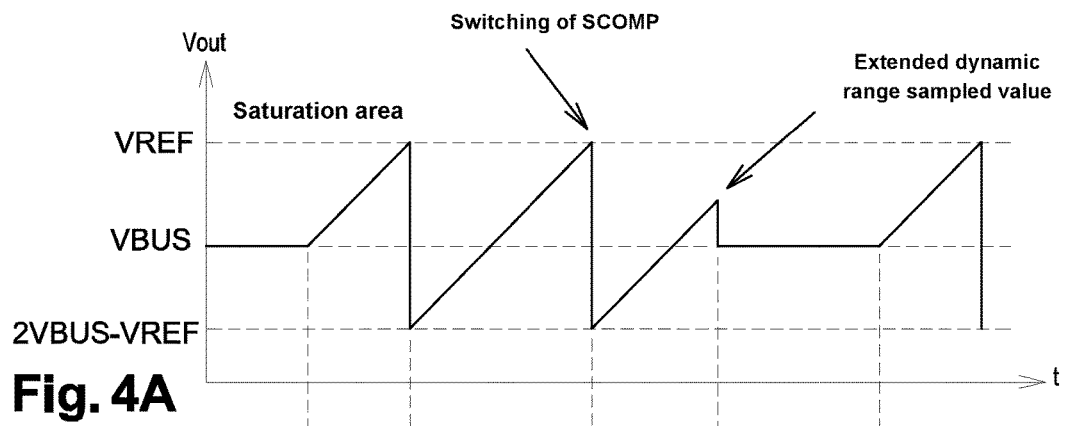
FIGS. 4A-C show a timing diagram illustrating the output signal of the integration stage and signals for resetting the device of FIG. 2.
Figure 4B:
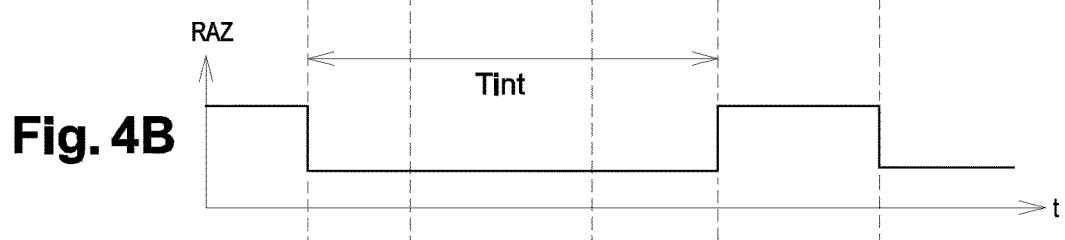
Figure 4C:
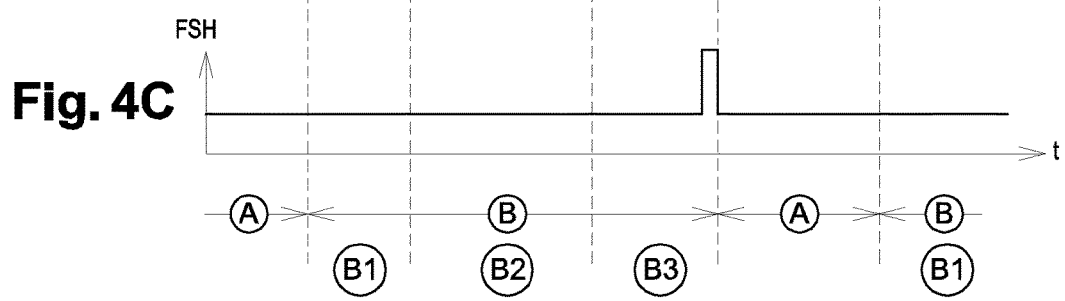

The operation of device 60 will now be described in relation with FIGS. 4A-C.

Before starting a phase of integration of an electric current I (phase "A"), signals HDraz and HDinv are activated to the high state by generator 92 on reception of a predetermined value of control signal RAZ, complemented signal $\overline{\text{HDinv}}$ being thus also taken to the low state by generator 92. Switches 66, 78, and 82 are thus in their on state, switches 88, 90 are in their off state, and outputs HD[2:0] of counter 96 are set to the low state. The turning on of switch 66 discharges capacitor 64, and after this resetting, output voltage $V_{out}$ is equal to VBUS. Voltage VREF being greater than voltage VBUS, the output of comparator 94 is thus set to its lowest value. During this initialization phase, during which signal HDraz is activated to the high state, autozero system 98 is also implemented as known by those skilled in the art.

Control RAZ is then released, generator 92 triggers the turning off of switch 66 and keeps the state of signals HDinv and $\overline{\text{HDinv}}$. The turning off of switch 66 thus marks the beginning of the phase of integration of current I received as an input (phase "B"), autozero system 98 is active to subtract the offset at the input of amplifier 62 during the entire integration phase. Generator 92 and switch 66 thus form an initialization circuit of the device which determines the time of the beginning of the integration period from the falling edge of signal RAZ to the rising edge of signal RAZ which marks the end time of the integration period. Due to the integration, voltage $V_{out}$ at the output of amplifier 62 increases from value VBUS (phase "B1").

If during the entire integration phase of duration $T_{int}$, voltage $V_{out}$ remains smaller than reference voltage VREF, no new logic condition appears at the output of binary counter 96. The operation of device 60 is then identical to that of a CTIA of the state of the art, such as described in relation with FIGS. 1 and 2, and output signal HD[2:0] thus remains in the low state.

However, if during the integration phase, output voltage $V_{out}$ reaches or exceeds value VREF, output $S_{COMP}$ of comparator 94 switches state, which propagates the high state at the comparator output to the input of the clock of binary counter 96, which then activates least significant bit HD0 to 1. One then has HD[2:0]=001.

The switching of a bit of signal HD[2:0] from the low state to the high state is detected by phase generator 92. As a response, the latter switches control signals HDinv and $\overline{\text{HDinv}}$ respectively to the low state and to the high state.

This results in the switching of the connections of capacitor 64 between amplifier 62 and autozero circuit 98.

At the time when condition $V_{out}$=VREF is fulfilled, the quantity of electric charges Q stored in capacitor 64 is equal to:

$$Q=C_{int} \cdot (VREF-VBUS) \quad (2)$$

After the switching of capacitor 64, load Q across the CTIA has a reverse biasing with respect to that discussed before the switching, so that the output of amplifier 62 is equal to:

$$V_{out}=2 \cdot VBUS-VREF \quad (3)$$

The output of comparator 94 then switches to the low state since voltage $V_{out}$ is smaller than reference voltage VREF. The switching of capacitor 64 then takes the output of amplifier 62 to a lower level. To avoid saturating the CTIA, voltage VBUS and voltage VREF are selected to fulfill relation:

$$2 \cdot VBUS-VREF \geq VsatL$$

For example, voltage VBUS is adjusted above, and advantageously at the central point of the linear dynamic range of the CTIA, voltage VBUS thus complying with relation:

$$VBUS \geq \frac{V_{satL}+V_{satH}}{2}$$

Beyond this time, the integration phase carries on (phase "B2"), the output of amplifier 62 resuming its growth in the linear read-out dynamic range, with no information loss.

If output $V_{out}$ of amplifier 62 reaches or exceeds again value VREF before the end of the integration, output $S_{COMP}$ of comparator 94 changes polarity again and increments counter 96 once again. The binary output thereof is then set to HD[2:0]=010.

On reception of the switching of a bit of signal HD[2:0], generator 92 switches signals HDinv and $\overline{HDinv}$, in the present case respectively in the high state and the low state, which causes the switching of capacitor 64. Electric load Q across the CTIA has, again, a reverse biasing with respect to that discussed before the switching, and the output of amplifier 62 is thus taken to $V_{out}$=2·VBUS−VREF and the output of comparator 94 switches to the low state since $V_{out}$<VREF. A new phase of growth of output $V_{out}$ from value 2·VBUS−VREF is then implemented (phase "B3"). The capacitor can thus switch repeatedly with no information loss all the way to the maximum value of binary counter 96, as an example here over 3 bits, that is, maximum value $HD_{SH}$[2:0]=111.

Once integration duration $T_{int}$ has elapsed, output voltage $V_{out}(T_{int})$ is sampled and held in sample-and-hold device 68 by the sending of a pulse for signal FSH, as in the conventional integration mode, while the binary values of signal HD[2:0] are also stored in a latch-type memory stage 76 on reception of the pulse of the same signal FSH. Device 60 thus supplies at the end of an integration phase a signal $HD_{SH}$[2:0] representing the number of switchings of capacitor 64 as well as voltage $V_{outSH}$ equal to the voltage at the output of amplifier 62. Signal FSH is for example activated to the high state by a circuit for managing the digital control signals (not shown) for a short period just before the end of the integration, that is, before the rising edge of signal RAZ, as indicated in FIGS. 4B and 4C which also specify the times of beginning and end of the integration period. Other mechanisms for adjusting the times of beginning and end of the integration period are of course possible.

Capacitance $C_{int}$ of stage CTIA and the binary counter can then be reset by activation of control signal RAZ before a new integration cycle, as previously indicated.

In the end, the total voltage $V_{out}^{final}$ corresponding to the electric charges integrated by CTIA 62, 64 during the integration phase is thus equal to:

$$V_{out}^{final}=V_{outSH}+2 \cdot conv_{10}(HD_{SH}[2:0]) \times (VREF-VBUS) \quad (4)$$

where $conv_{10}(HD_{SH}[2:0])$ is the conversion to a decimal value of $HD_{SH}$[2:0], that is, the number of switchings of the capacitor.

The equivalent read-out dynamic range can thus be automatically increased by value $2 \cdot (2^n) \cdot (VREF-VBUS)$, or in other words multiplied by $2^n$, where n is the number of bits of binary counter 96, which may correspond to a much higher dynamic range than that of a conventional CTIA, according to the maximum value of the binary counter used and to the value of reference voltage VREF.

A plurality of variations are possible for the use of signals $HD_{SH}$[2:0] and $V_{outSH}$.

In a first variation, a conversion system and a calculation unit complete device 60. Conversion unit converts signals $HD_{SH}$[2:0] and $V_{outSH}$ into digital values and the calculation unit calculates a final digital voltage according to the digital values of signals $HD_{SH}$[2:0] and $V_{outSH}$ based on relation (4).

In a second variation, a digital-to-analog converter and an adder complete device 60. The converter generates an analog voltage equal to $2 \cdot conv_{10}(HD_{SH}[2:0]) \times (VREF-VBUS)$ according to signal $HD_{SH}$[2:0], and the adder adds the voltage thus generated to voltage $V_{outSH}$, or even directly voltage $V_{out}$ at the output of amplifier 62.

In a third variation, a single output Video is used to implement the detector according to the invention.

In a fourth variation, only signal $HD_{SH}$[2:0] is supplied, it then being considered as a conversion into digital of the analog current received as an input. The device according to the invention is thus, in this context, an analog-to-digital converter. The number of bits of the counter and value VREF are then selected to define the converter quantization pitch, as well as its dynamic range.

The implementation of the initial design, and then of the variable configuring or programming in operation of a detector according to the invention, is within the abilities of those skilled in the art, by means of usual architectures and protocols of digital programming of modern detectors, for example, the enabling or the inhibition on demand in a very simple and immediate way of the "extended dynamic range" function, or the forcing from the outside of one of the possible values of the total equivalent integration capacity ($2^n \cdot C_{int}$).

A binary information over one or a plurality of digital bits synchronously indicating to the output signal whether a given pixel has been the object of a "saturation" or not is available in parallel with analog output VIDEO. This feature enables to conveniently and rapidly process all the image data, such as for example for video representation (immediate serial management data for a controlled use in the display dynamic range, for example) or any other informative use or use for an analog or digital processing of the data flow, in relation with the occurrence of a local "saturation" phenomenon.

Figure 1:
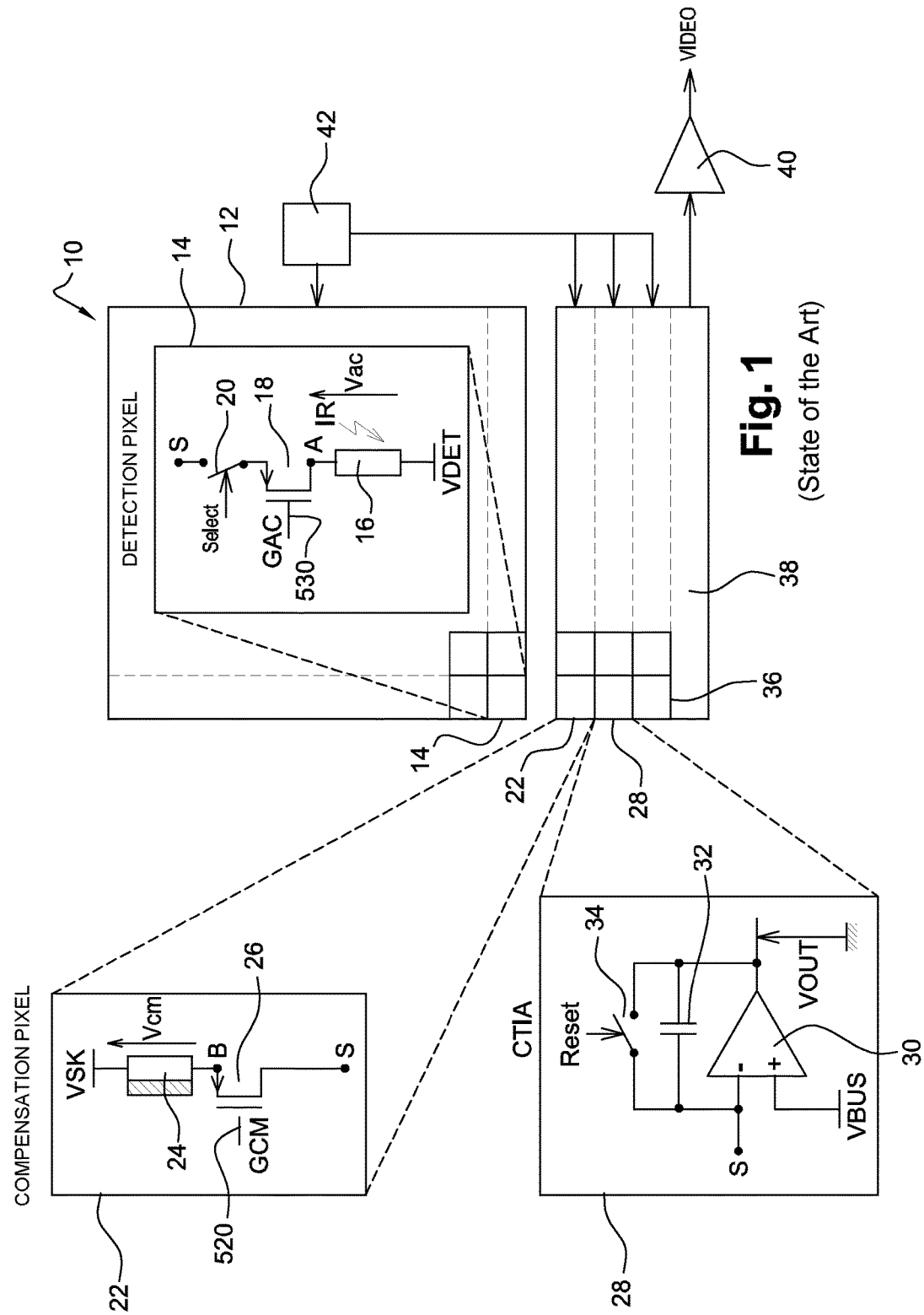
FIG. 1 is an electric diagram of an infrared bolometric detector of the state of the art comprising CTIA-type integrators for the measurement of the currents generated by the detection elements, already described hereabove.
Figure 2:
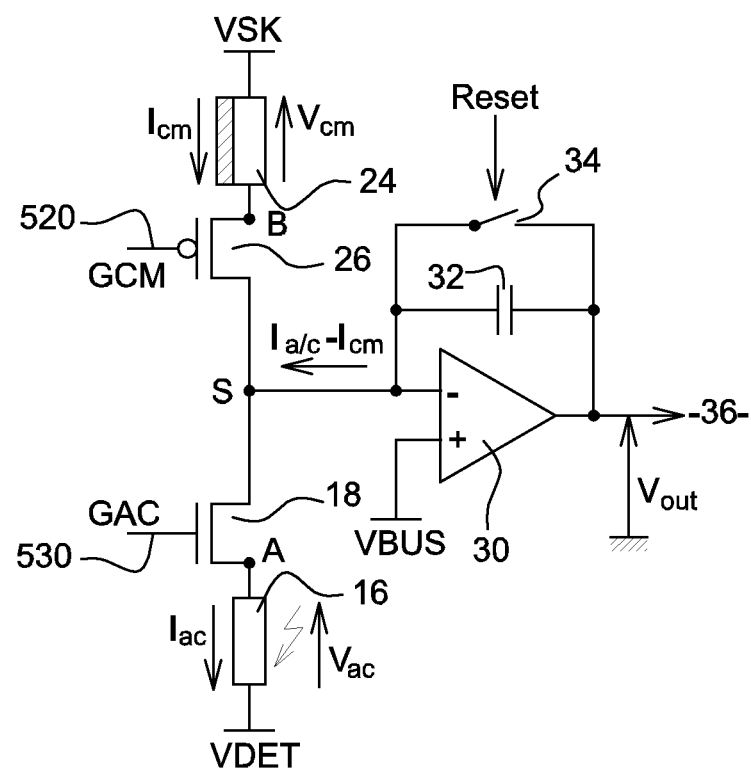
FIG. 2 is an electric diagram illustrating the reading out of a sensitive bolometer of the detector of FIG. 1 by means of a compensation structure.

For example, in the context of a bolometric detector, such as described in relation with FIGS. 1 and 2, CTIAs 28 are replaced with devices 60 just described. For example, sample-and-hold circuits 68 of devices 60 are sample-and-hold circuits 36 and a second multiplexer is provided to deliver signals $HD_{SH}[2:0]$ in multiplexed mode. A conversion unit and a calculation unit then complete the detector to digitally restore the final voltage originating from each pixel 14.

Figure 5A:
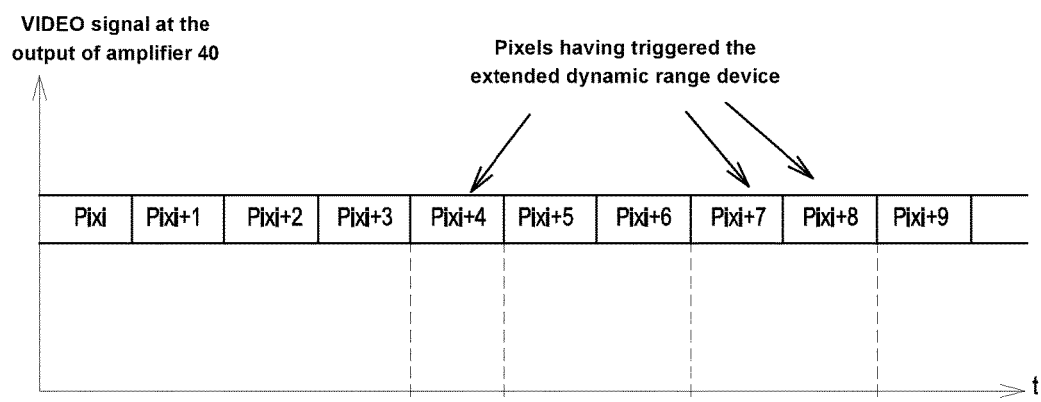
FIGS. 5A-B show a timing diagram illustrating an extension of the read-out dynamic range of the device of FIG. 3 in the context of a use of this device as an integration device of an array detector.
Figure 5B:
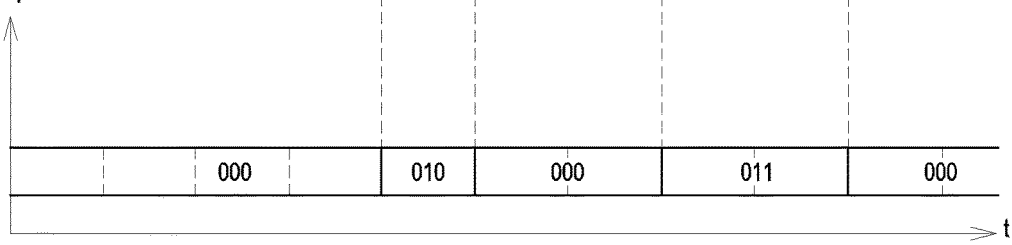

FIGS. 5A-B show an example of output of binary signals HD[2:0] in a specific case where three pixels "Pix i+4", "Pix i+7", and "Pix i+8", in a multiplexed sequence, would have triggered the extension of the dynamic range according to the invention by causing from one to several times the switching of capacitor 46.

In the context of an application to detection, the invention thus enables to keep an optimal sensitivity on the areas formed of all the pixels which do not cause the crossing of reference voltage VREF, that is, which do not saturate, VREF being selected to be smaller than or equal to saturation voltage $V_{satH}$, while providing an exploitable signal on the areas of the image where the scene temperature is such that it would have made the voltage at the output of amplifier 62 saturate in the absence of the invention, that is, too high as compared with the nominal scene dynamic range (here, thermal). The output would have been deprived of information relative to the observed scene on these areas. A high sensitivity and a high scene dynamic range are thus obtained.

According to an advantageous feature of the invention, the extension of the read-out dynamic range implemented by the integration device according to the invention may be activated or deactivated form the outside, for example, by means of a manual command or by software means, via a digital input "HD_MODE_ON", such as illustrated in FIG. 3, transmitted by means of a programming interface, for example, the interface usually equipping the read-out circuits of detectors of the state of the art, or also directly externally programmed via a dedicated input.

The read-out circuit incorporating the device according to the invention can thus be used at any moment either in normal mode, that is, in accordance with the operating mode described in relation with FIGS. 1 and 2, or in "extended scene dynamic range" mode. Typically, command "HD_MODE_ON" forces the low level at the output of comparator 94, and, thereby, counter 96 never changes state, and the switching of capacitor 64 is thus never activated. It should be noted that the setting of voltage VREF to any value greater than the maximum output voltage of the CTIA (generally greater than $V_{satH}$ due to the previously-specified linearity conventions) also has the effect of inhibiting the extension of the scene dynamic range of the sensor since output $S_{COMP}$ of comparator 94 is kept in the low state. The forcing of VREF to the same value as the power supply voltage of the amplifier will also have this inhibiting effect on the dynamic range extension device.

A single capacitor 64 has been described. As a variation, a plurality of capacitors, selected in programmed fashion, are provided in parallel, to form an integration capacitor $C_{int}$ programmable over a plurality of values, as known per se in the state of the art. This enables to respond to different fields of application of the detector and provides the user with an external adjustment of the scene dynamic range. In this embodiment, the variation of capacitance $C_{int}$ is also plotted to restore the final voltage, the reconstruction being within the abilities of those skilled in the art.

A 3-bit binary counter has been described. Of course, the number of bits of the counter depends on the targeted application. Further, the number of bits may be selected to be very large in order never to reach the maximum value thereof.

Similarly, other types of counting circuits may be envisaged. For example, the output of comparator 62 is directly connected to the input of generator 92 which drives the different signals according to the switching of the comparator output, and the comparator output is supplied to a data processing unit which stores the number of switchings. The maximum number of switchings is thus dictated by the storage capacity of this unit and may be almost infinite.

A specific application according to which the polarity of the integrated current and the architecture of the integration device cause an increase in output voltage $V_{out}$ of the operational amplifier according to the quantity of charge stored in the capacitor has been described. As a variation, the polarity of the current and/or the architecture of the integration device induce a decrease in voltage $V_{out}$ at the output of the amplifier as the quantity of charges stored in the capacitor increases. In such a variation, voltage VREF is selected to be greater than or equal to low saturation voltage $V_{satL}$ and voltage VBUS is selected to comply with relation $2 \cdot VBUS - VREF \leq V_{satH}$. The comparator at the amplification output then switches from a first value to a second value when voltage $V_{out}$ is decreasing and equal to VREF, the switching being counted by the binary counter and causing the switching of the capacitor.

A reference voltage VREF constant over time has been described. As a variation, this voltage is also programmable, its value being capable of varying even during the integration phase.

According to a very simplified alternative embodiment, by adjusting the values of capacitance $C_{int}$ and of reference voltage VREF (according to the product) in integrated fashion in the architecture/internal wiring of the read-out circuit, the user has nothing to provide in terms of acquisition and/or data processing protocol to simultaneously have an extended dynamic range and a high sensitivity, which results in a high user friendliness.

A detector using the invention to integrate the electric current originating from a critical site, for example, a bolometer, has a number of advantages over prior art reading circuits, in particular:

the access to an extended scene dynamic range while keeping a high sensitivity on the image portion which can be transcribed in the nominal electric dynamic range of the CTIA alone while the linearity of the signal according to the flow is kept, conversely to certain logarithmic response systems, for example;

the frame frequency (defined by the number of times when the entire array is read within one second) is kept identical to usual standards (60 Hz, for example). In other words, there is no degradation of the information time density with respect to certain forms of the state of the art in terms of dynamic range extension;

the obtained scene information is kept in permanent time consistency or synchronicity with the scene. Indeed, the time interval separating any event in the scene from the forming of the signal usable by the observer or the system using the output flow of signals $V_{out}$ does not exceed a frame time, conversely to all detectors or systems having a data flow which is oversampled and/or processed by calculation after the forming of the raw signals to obtain the information considered as usable with an extended dynamic range;

a simplification of the detector use. Indeed, in the state of the art, the user should generally himself select the operating point of the detector according to the observed scene temperature range. Generally, to give a general idea, the different operating points are necessary to cover dynamic range [−40° C.; +1,000° C.] with no saturation;

as compared with methods of the technical field based on the adaptation of the integration time, the invention provides the advantage of not modifying the thermal cycle of the bolometer imposed by the self-heating by Joule effect during the integration cycle. Such a feature is particularly advantageous in terms of stability of the continuous level according to the ambient thermal operating conditions, in particular, when small scene temperature differences are searched for with a good time stability. The possible implementation efficiency of the detector with no Peltier stabilization module (so-called TEC-less operation), more and more current in the field, is thus kept;

There is no resetting noise on inversion of the integration capacitance, as in certain forms of prior art, since the latter is never emptied, until after the time when signal $V_{out}$ is sampled;

Further, the stray capacitances for example formed by the gates of the connection switches and the actual connections form an integral part of the integration capacitance and add no parasitic disturbance. The signal formed at the output is thus not altered by application of the invention.

The invention claimed is:

1. A device for integrating an electric current received on an integration node for a period of predetermined duration $T_{int}$, comprising an operational amplifier having a first and a second input and an output, and a capacitor having two terminals connected between the first input and the output of the operational amplifier, the second input of the amplifier being taken to a constant voltage VBUS, the first input of the amplifier being connected to the integration node, and the output terminal of the operational amplifier supplying an output voltage $V_{out}$ which varies monotonously in a predetermined variation direction according to a quantity of electric charges of predetermined polarity stored in the capacitor, output voltage $V_{out}$ of the operational amplifier being saturated at a high saturation voltage $V_{satH}$ when the quantity of electric charges of said polarity stored in the capacitor is greater than a predetermined threshold, and output voltage $V_{out}$ of the operational amplifier being saturated at a low saturation voltage $V_{satL}$ when the quantity of electric charges of said polarity stored in the capacitor is smaller than a predetermined threshold, wherein the device further comprises:
a circuit for switching the capacitor terminals between
a first position in which a first terminal of said capacitor is connected to said first input of said operational amplifier and a second terminal of said capacitor is connected to said output of said operational amplifier; and
a second position in which said first terminal of said capacitor is connected to said output of said operational amplifier and said second terminal of said capacitor is connected to said first input of said operational amplifier;
a circuit for triggering the switching circuit at least once during integration period $T_{int}$ when output voltage $V_{out}$ of the operational amplifier both varies in said variation direction and is substantially equal to a reference voltage VREF; and a storage circuit for storing the number of triggerings having occurred between the initial time and the end time of the integration period, and wherein:
when said variation direction is increasing, said reference voltage VREF is smaller than or equal to high saturation voltage $V_{satH}$, and reference voltage VREF and voltage VBUS of the second input of the operational amplifier are selected to comply with relation $2 \cdot \text{VBUS} - \text{VREF} \geq V_{satL}$; or when said variation direction is decreasing, said reference voltage VREF is greater than or equal to low saturation voltage $V_{satL}$, and reference voltage VREF and voltage VBUS of the second input of the operational amplifier are selected to comply with relation $2 \cdot \text{VBUS} - \text{VREF} \leq V_{satH}$.

2. The electric current integration device of claim 1:
wherein the switching circuit comprises:
a first controllable switch connected between the first input of the operational amplifier and the first terminal of the capacitor;
a second controllable switch connected between the output of the operational amplifier and the second terminal of the capacitor;
a third controllable switch connected between the first input of the operational amplifier and the second terminal of the capacitor;
a fourth controllable switch connected between the output of the operational amplifier and the first terminal of the capacitor,
and wherein:
the first and the second controllable switches are controlled by a first binary control signal HDinv;
the third and the fourth controllable switches are controlled by a second binary control signal $\overline{\text{HDinv}}$, the second binary signal $\overline{\text{HDinv}}$ being the complement of first binary signal HDinv.

3. The electric current integration device of claim 1, wherein the triggering circuit comprises a comparator having a first input connected to the output of the operational amplifier and a second input connected to the reference voltage VREF, the comparator generating a first voltage on an output when the voltage on its first input is lower than the voltage on its second input, and generating a second voltage, different from the first voltage, on the output when the voltage on its first input is greater than the voltage on its second input, so that a condition necessary for the triggering of the switching circuit implemented by the triggering circuit is fulfilled:
on switching from the first voltage to the second voltage if said variation direction is increasing; or
on switching from the second voltage to the first voltage if said variation direction is decreasing.

4. The electric current integration device of claim 1, wherein the triggering of the switching of the capacitor implemented by the triggering circuit comprises fulfilling at the same time:
a first sub-condition according to which output voltage $V_{out}$ of the operational amplifier varies in said variation direction and is substantially equal to the reference voltage VREF; and
a second sub-condition according to which the number of times when the first subcondition has been fulfilled from the initial time of integration period $T_{int}$ is shorter than a predetermined maximum number.

5. The electric current integration device of claim 4, wherein the triggering circuit comprises a binary counter over n bits having a counting input connected to the output of the comparator and an output supplying the number of times from the initial time of integration period $T_{int}$ where the output of the comparator switches from the first voltage to the second voltage when said variation direction is increasing or switches from the second voltage to the first voltage when said variation direction is decreasing.

6. The electric current integration device of claim 2, wherein the triggering circuit comprises a signal generator connected to the output of the binary counter and switching the first and second binary control signals HDinv, $\overline{\text{HDinv}}$ of the switches when the output of the binary counter is incremented.

7. The electric current integration device of claim 5, wherein the triggering circuit comprises a signal generator connected to the output of the binary counter and switching the first and second binary control signals HDinv, $\overline{\text{HDinv}}$ of the switches when the output of the binary counter is incremented.

8. An electromagnetic radiation detection system comprising:
   a detection element generating on an output terminal an electric current according to the electromagnetic radiation; and
   the device of claim 1, the first input of the operational amplifier being connected to the output terminal of the detection element for the integration of the current generated by the detection element.

9. The electromagnetic radiation detection system of claim 8, wherein the detection element comprises:
   a detection branch comprising a detection bolometer having a membrane suspended above a substrate and a bias circuit for setting the voltage across the detection bolometer according to a voltage set point;
   a compensation branch comprising a compensation bolometer substantially taken to the substrate temperature, and a bias circuit for setting the voltage across the compensation bolometer according to a voltage set point; and
   means for forming the difference between current $i_{sc}$ running through the detection bolometer and current $i_{cm}$ running through the compensation bolometer to form the electric current to be integrated.

10. A method of integrating an electric current during a predetermined integration duration $T_{int}$ in a capacitor having two terminals connected between a first input and the output of an operational amplifier, the operational amplifier comprising a second input taken to a constant voltage VBUS, output voltage $V_{out}$ of the operational amplifier varying monotonously in a predetermined variation direction according to a quantity of electric charges of predetermined polarity stored in the capacitor, said output voltage $V_{out}$ being saturated at a high saturation voltage $V_{satH}$ when the quantity of electric charges stored in the capacitor is greater than a predetermined threshold, and output voltage $V_{out}$ of the operational amplifier being saturated at a low saturation voltage $V_{satL}$ when the quantity of electric charges of said polarity stored in the capacitor is smaller than a predetermined threshold, the method comprising the steps of:
   a) before the initial time of integration period $T_{int}$, initializing to zero the capacitor charge and a counting value;
   b) integrating during integration period $T_{int}$ the electric current in the capacitor;
   c) switching the capacitor terminals at least once during integration period $T_{int}$ when the output voltage of the operational amplifier both varies in said variation direction and is equal to a predetermined reference voltage VREF, said switching occurring between a first position, in which a first terminal of said capacitor is connected to said first input of said operational amplifier and a second terminal of said capacitor is connected to said output of said operational amplifier, and a second position, in which said first terminal of said capacitor is connected to said output of said operational amplifier and said second terminal of said capacitor is connected to said first input of said operational amplifier,
   when said variation direction is increasing, said reference voltage VREF being smaller than or equal to high saturation voltage $V_{SatH}$, and reference voltage VREF and voltage VBUS of the second input of the operational amplifier are selected to comply with relation $2 \cdot \text{VBUS} - \text{VREF} \geq V_{satL}$; or when said variation direction is decreasing, said reference voltage VREF is greater than or equal to low saturation voltage $V_{satL}$, and reference voltage VREF and voltage VBUS of the second input of the operational amplifier are selected to comply with relation $2 \cdot \text{VBUS} - \text{VREF} \leq V_{satH}$;

d) incrementing by one the counting value after each switching of the capacitor during integration period $T_{int}$; and
   e) after the end time of integration period $T_{int}$, supplying the counting value.

* * * * *